(12) United States Patent
Cook et al.

(10) Patent No.: US 10,923,457 B2
(45) Date of Patent: Feb. 16, 2021

(54) MULTI-DIE MODULE WITH CONTACTLESS COUPLER AND A COUPLING LOSS REDUCTION STRUCTURE

(71) Applicant: TEXAS INSTRUMENTS INCORPORATED, Dallas, TX (US)

(72) Inventors: Benjamin Stassen Cook, Addison, TX (US); Bichoy Bahr, Allen, TX (US); Baher Haroun, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 38 days.

(21) Appl. No.: 16/231,555

(22) Filed: Dec. 23, 2018

(65) Prior Publication Data
US 2020/0203314 A1    Jun. 25, 2020

(51) Int. Cl.
*H01L 25/065* (2006.01)
*H01F 38/14* (2006.01)
*H03B 5/08* (2006.01)
*H01L 21/673* (2006.01)

(52) U.S. Cl.
CPC ......... *H01L 25/0657* (2013.01); *H01F 38/14* (2013.01); *H01L 21/67379* (2013.01); *H03B 5/08* (2013.01)

(58) Field of Classification Search
CPC ........... H01L 25/0657; H01L 21/67379; H01F 38/14; H03B 5/08
USPC ....................................................... 257/686
See application file for complete search history.

(56) References Cited

U.S. PATENT DOCUMENTS

2011/0049693 A1*    3/2011 Nakashiba .............. H01L 24/32
                                                                257/676

\* cited by examiner

*Primary Examiner* — Tong-Ho Kim
(74) *Attorney, Agent, or Firm* — Ray A. King; Charles A. Brill; Frank D. Cimino (57) ABSTRACT

A multi-die module includes a first die with a first device and a second die with a second device. The multi-die module also includes a contactless coupler configured to convey signals between the first device and the second device. The multi-die module also includes a coupling loss reduction structure.

11 Claims, 7 Drawing Sheets

MULTI-DIE MODULE WITH CONTACTLESS COUPLER AND A COUPLING LOSS REDUCTION STRUCTURE

BACKGROUND

The proliferation of electronic devices with integrated circuit (IC) components continues. There are many different IC fabrication and packaging strategies, each strategy with its own pros and cons. Although IC fabrication technology provides an excellent platform for manufacturing circuits with repeated components, there are unmet challenges when it comes to manufacturing IC circuits with different types of components. The result of existing IC fabrication limitations is that IC components are often limited to a particular type of component and thus multiple IC dies or chips need to be connected together to complete a desired circuit.

While direct coupling of a first device on a first die and a second device on a second die is possible (e.g., using wires, pads, solder, etc.), avoiding direct coupling facilitates packaging. Alternatives to direct coupling include contactless coupling options such as capacitive coupling and inductive coupling. However, in many scenarios, there are unwanted performance drawbacks resulting from contactless coupling. As an example, inductive coupling in an oscillator circuit (e.g., between a first die with a resonator and a second die with an oscillator core) undesirably reduces the quality factor of the oscillator circuit. Efforts to improve multi-die circuit packaging and performance are ongoing.

SUMMARY

In accordance with at least one example of the disclosure, a multi-die module comprises a first die with a first device and a second die with a second device. The multi-die module also comprises a contactless coupler configured to convey signals between the first device and the second device. The multi-die module also comprises a coupling loss reduction structure.

In accordance with at least one example of the disclosure, a multi-die module fabrication method comprises obtaining a first die with a first device and obtaining a second die with a second device. The fabrication method also comprises providing a contactless coupler configured to convey signals between the first device and the second device. The fabrication method also comprises providing a coupling loss reduction structure.

BRIEF DESCRIPTION OF THE DRAWINGS

For a detailed description of various examples, reference will now be made to the accompanying drawings in which.

DETAILED DESCRIPTION

The disclosed examples are directed to multi-die modules that employ a contactless coupler and at least one coupling loss reduction structure. The contactless coupler enables signals to be conveyed between a first device on a first die of the multi-die module and a second device on a second die of the multi-die module. In at least some examples, the first device of the first die is an oscillator core, and the second device of the second die is a resonator.

In different examples, the orientation of the first and second dies in a multi-die module varies. In one example, the first and second dies are oriented such that the first and second devices face each other (e.g., one of the dies is flipped). In another example, the first and second dies are oriented such that the first die faces a back side of the second die or vice versa. Regardless of die orientation, the contactless coupler enables signaling between the first device of the first due and the second device of the second die.

In some examples, the contactless coupler is an inductive coupler (e.g., a transformer). In other examples, the contactless coupler is a capacitive coupler (e.g., one or more capacitors). To reduce coupling losses, disclosed multi-die modules include one or more coupling loss reduction structures. In some examples, a coupling loss reduction structure is a cavity formed in a die substrate. In other examples, a coupling loss reduction structure is a magnetic material formed between a contactless coupler component of a given die and the die's substrate. In other examples, a coupling loss reduction structure is a magnetic core between contactless coupler components. In other examples, a coupling loss reduction structure is a redistribution layer (RDL) with at least part of the contactless coupler. In some examples, different coupling loss reduction structures are combined. To provide a better understanding, various multi-die module options, contactless coupler options, and coupling loss reduction structure options are described using the figures as follows.

Figure 1:
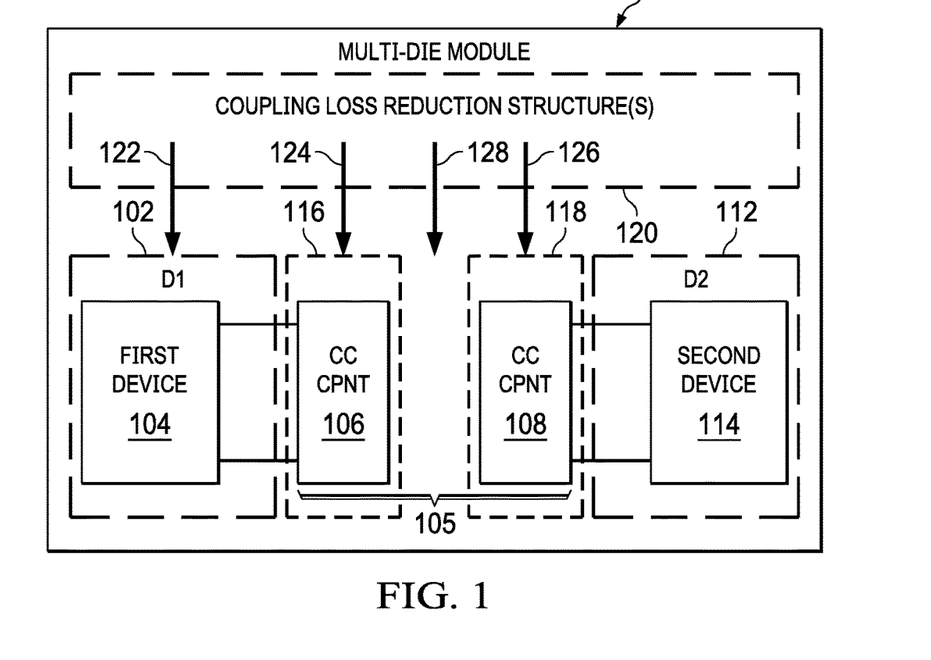
FIG. 1 shows a block diagram of a multi-die module in accordance with various examples.

FIG. 1 shows a block diagram of a multi-die module 100 in accordance with various examples. As shown, the multi-die module 100 includes a first die 102 with a first device 104 and a second die 112 with a second device 114. A contactless coupler 105 with contactless coupler components 106 and 108 (labeled "CC CPNT" in FIG. 1) is configured to convey signals between the first device 104 and the second device 114. In different examples, the position and/or layout for each of the contactless coupler components 106 and 108 varies. In one example, the contactless coupler component 106 is part of an optional portion 116 of the first die 102 and the contactless coupler component 108 is part of an optional portion 118 of the second die 112. In another example, both of the contactless coupler components 106 and 108 are part of the optional portion 116 of the first die 102. In another example, both of the contactless coupler components 106 and 108 are part of the optional portion 118 of the second die 112. In another example, one or both of the contactless coupler components 106 and 108 are manufactured separate from the first and second dies 102 and 112, and are later coupled to the first die 102 and/or the second die 112 as appropriate. In different examples, the contactless coupler components 106 and 108 correspond to inductor coils or capacitor terminals.

To reduce signal loss/distortion when signaling with the contactless coupler 105, the multi-die module 100 includes coupling loss reduction structure(s) 120, where each structure 120 can be used together or separately. In different examples, the coupling loss reduction structure(s) 120 include a first coupling loss reduction structure 122 applied to the first die 102, a second coupling loss reduction structure 124 applied to the optional portion 116 of the first die 102, a third coupling loss reduction structure 126 applied to the optional portion 118 of the second die 112, and a fourth coupling loss reduction structure 128 applied between the contactless coupler components 106 and 108.

More specifically, in some examples, the first coupling loss reduction structure 122 corresponds to a cavity formed in a substrate (e.g., of the first die 102), where the cavity is aligned with the contactless coupler components 106 and 108. In some examples, the cavity is formed by etching a substrate. In some examples, the second coupling loss reduction structure 124 corresponds to a magnetic material on the first die 102 between the contactless coupler component 106 and a substrate of the first die 102. In other examples, the second coupling loss reduction structure 124 corresponds to an RDL of the first die 102 that forms at least part of the contactless coupler component 106. In other examples, the second coupling loss reduction structure 124 corresponds to the above-noted magnetic material and RDL of the first die 102. In some examples, the third coupling loss reduction structure 126 corresponds to a magnetic material between the contactless coupler component 108 and a substrate of the second die 112. In other examples, the third coupling loss reduction structure 126 corresponds to an RDL of the second die 112 that forms at least part of the contactless coupler component 108. In other examples, the third coupling loss reduction structure 126 corresponds to the above-noted magnetic material and RDL of the second die 112.

In some examples, the fourth coupling loss reduction structure 128 corresponds to a magnetic core between contactless coupler components 106 and 108 of the contactless coupler 105. In other examples, the fourth coupling loss reduction structure 128 corresponds to an RDL and/or other materials between the contactless coupler components 106 and 108. In some examples, one or both of the contactless coupler components 106 and 108 are formed on the fourth coupling loss reduction structure 128. In some examples, the fourth coupling loss reduction structure 128 is fabricated as part of the first die 102 or the second die 112. In other examples, the fourth coupling loss reduction structure 128 is fabricated separately from the first die 102 and the second die 112. When fabricated separately from the first die 102 and the second die 112, the fourth coupling loss reduction structure 128 is subsequently inserted between the first die 102 and the second die 112. If the fourth coupling loss reduction structure 128 includes one or both contactless coupler components 106 and 108, then coupling the contactless coupler components 106 and 108 to respective devices of the first die 102 or the second die 112 is performed as appropriate.

In at least some examples, the first device 104 includes an oscillator core. Additionally, in some examples, the first device 104 includes circuitry coupled to an oscillator core (e.g., clock components, a transmitter, a receiver, a processing unit, logic blocks, etc.). In different examples, the first device 104 is formed using metal-oxide semiconductor (MOS) components or bipolar semiconductor components. Meanwhile, in some examples, the second device 114 is a micro-electro-mechanical system (MEMS). In one example, the second device is a bulk-acoustic wave (BAW) resonator. For examples where the first device 104 is an oscillator core and the second device 114 is a resonator, the coupling loss reduction structure(s) 120 are provided to ensure the quality factor of the multi-die module 100 is higher than a predetermined threshold, which results in compliance with predetermined noise performance and/or power consumption criteria.

Figure 2:
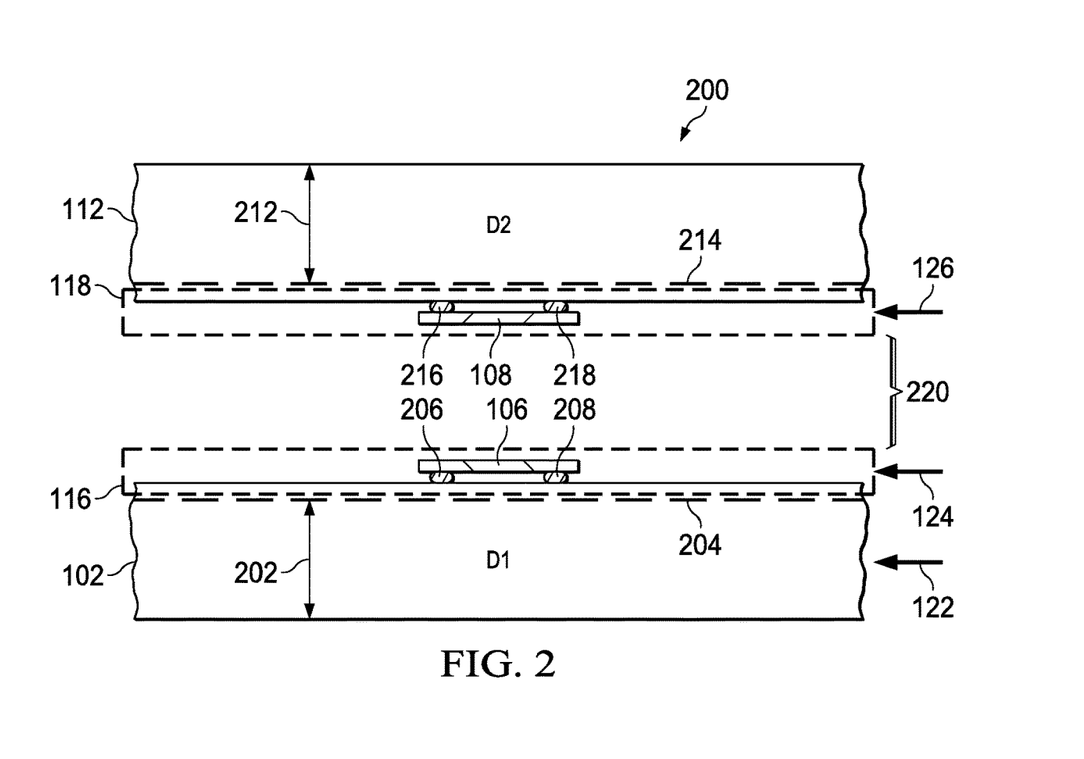
FIG. 2 shows a multi-die module layout in accordance with various examples.

FIG. 2 shows a multi-die module layout 200 in accordance with various examples. In the multi-die module layout 200, the first die 102 includes a substrate 202 that extends to line 204. Above line 204 of the first die 102 reside device components associated with the first device 104. Meanwhile, the second die 112 is flipped relative to the first die 102 and includes a substrate 212 that extends to line 214. Below line 214 of the second die 122 reside device components associated with the second device 114.

With the layout 200, device components above line 204 on the first die 102 face device components below line 214 on the second device 112 with fillable space 220 between the first die 102 and the second die 112. In different examples, the position of the fillable space 220 relative to the contactless coupler components 106 and 108 varies. In some examples, fillable space 220 is between the contactless coupler components 106 and 108 as shown. In other examples, fillable space 220 is between the contactless coupler component 106 and the first die 102. In other examples, fillable space 220 is between the contactless coupler component 108 and the second die 112. Regardless of its position, the fillable space 220 is fillable with a soft non-conductive filler material and/or a rigid non-conductive filler material. As appropriate, the fillable space 220 between contactless coupler components 106 and 108, and respective devices on the first die 102 or the second die 112 includes connectors (to connect each contactless coupler component with a respective device). In some examples, the contactless coupler components 106 and 108 are part of the first die 102 and/or the flipped second die 112. In another example, the contactless coupler components 106 and/or 108 are part of an RLD and/or other structures that are fabricated separately from the first die 102 and the second die 112, and are later coupled to the first die 102 and/or the second die 112 as appropriate. In one example, the contactless coupler component 106 is connected to the first die 102 via conductive paths 206 and 208. Likewise, the contactless coupler component 108 is connected to the second die 102 via conductive paths 216 and 218. The conductive paths 206, 208, 216, 218 correspond to metallic pads, metallic pins, metal layers, and/or solder.

As shown in layout 200, the contactless coupler component 106 resides in the optional portion 116 of the first die 102. Meanwhile, the contactless coupler component 108 resides in the optional portion 118 of the second die 112. In other examples, both of the contactless coupler components 106 and 108 reside in the optional portion 116 of the first die 102. In other examples, both of the contactless coupler components 106 and 108 reside in the optional portion 118 of the second die 112. In other examples, one or both of the contactless coupler components 106 and 108 reside in an RDL and/or other structures fabricated separately from the first die 102 and the second die 112. In such case, the contactless coupler components 106 and 108 are coupled to respective devices of the first die 102 and the second die 112 as appropriate.

Figure 3:
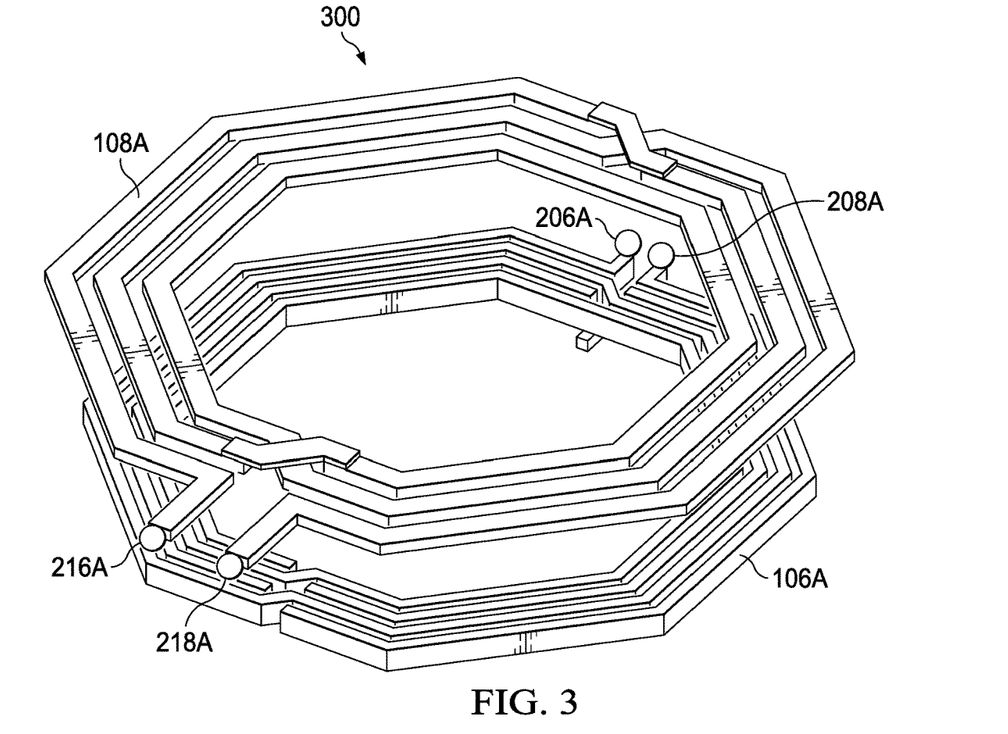
FIG. 3 shows an inductive coupler in accordance with various examples.

FIG. 3 shows an inductive coupler 300 in accordance with various examples. The inductive coupler 300 is an example of the contactless coupler 105 represented in FIG. 1. As shown in FIG. 3, the inductive coupler 300 comprises first and second contactless coupler components 106A and 108A in the form of inductors (e.g., planar inductive coils). Each of the contactless coupler components 106A and 108A includes respective connection points. More specifically, the connection points 206A and 208B for the contactless coupler component 106A are coupled to the first device 104 of the first die 102 via conductive paths (e.g., conductive paths 206 and 208 in FIG. 2) regardless of whether the contactless coupler component 106A is included with the first die 102. Similarly, the connection points 216A and 218B for the contactless coupler component 108A are coupled to the second device 114 of the second die 112 via conductive paths (e.g., conductive paths 216 and 218 in FIG. 2) regardless of whether the contactless coupler component 108A is included with the second die 104.

Figure 4A:
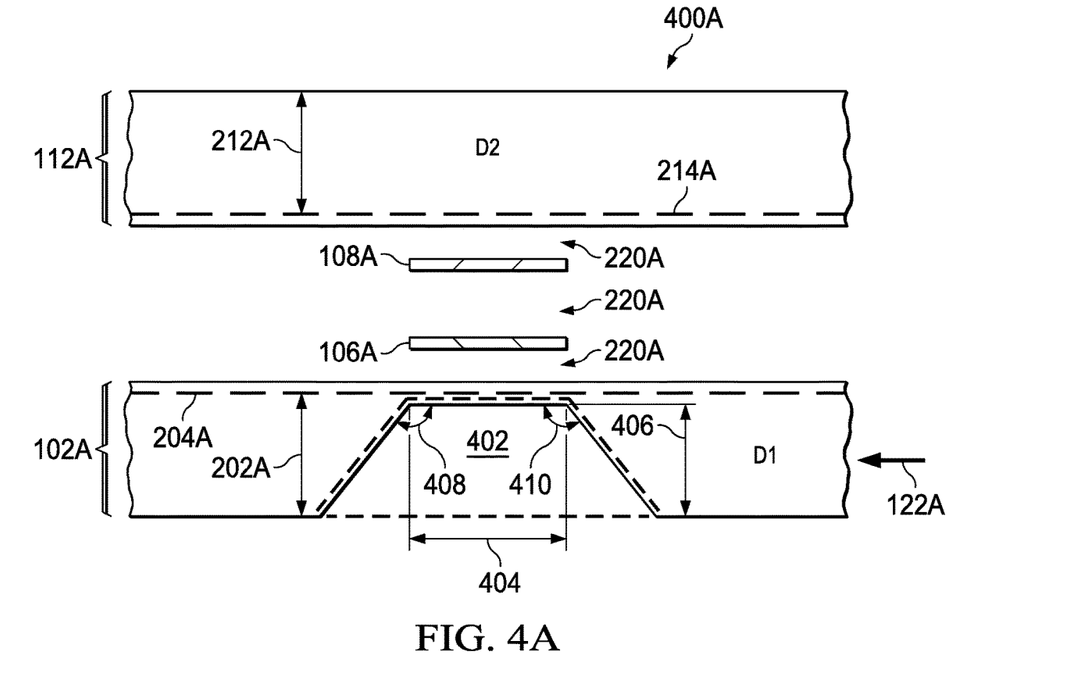
FIGS. 4A-4D show multi-die module layouts with different coupler loss reduction structures in accordance with various examples.

FIGS. 4A-4D show multi-die module layouts with different coupling loss reduction structures in accordance with various examples. In FIG. 4A, a multi-die module layout 400A with a coupling loss reduction structure 122A is represented. As shown, the first die 102A includes a substrate 202A that extends to line 204A. Above line 204A of the first die 102A reside device components associated with the first device 104 (see FIG. 1). Meanwhile, the second die 112A is flipped relative to the first die 102A and includes a substrate 212A that extends to line 214A. Below line 214A of the second die 112A reside device components of the second device 114 (see FIG. 1).

With the layout 400A, device components above line 204A on the first die 102A face device components below line 214A on the second die 112A with fillable space 220A between the first die 102A and the second die 112A. In different examples, the position of the fillable spaces 220A relative to the contactless coupler components 106A and 108A varies. In some examples, fillable space 220A is between the contactless coupler components 106A and 108A as shown. In other examples, fillable space 220A is between the contactless coupler component 106A and the first die 102A. In other examples, fillable space 220A is between the contactless coupler component 108A and the second die 112A. Regardless of its position, the fillable space 220A is fillable with a soft non-conductive filler material and/or a rigid non-conductive filler material. As appropriate, the fillable space 220A between contactless coupler components 106A and 108A, and respective devices on the first die 102A or the second die 112A includes conductive paths (to connect the contactless coupler components 106A and 108A with respective devices). In some examples, the contactless coupler components 106A and 108A are part of the first die 102A and/or the flipped second die 112A. In another example, the contactless coupler components 106A and/or 108A are part of an RDL and/or other structures that are fabricated separately from the first die 102A and the second die 112A, and are later coupled to the first die 102A and/or the second die 112A as appropriate.

In the layout 400A, the coupling loss reduction structure 122A corresponds to an etched cavity 402 in the substrate 202A of the first die 102A. In different examples, the depth 406 and width 404 of the etched cavity 402 varies. Coupling losses are generally reduced by removing as much of the substrate 202A aligned with the contactless coupler components 106A and/or 108A as possible without compromising the structural integrity of the first die 102A. In at least some examples, the width 404 is selected based on a size of the contactless coupler component 106A and/or 108A (e.g., the width 404 matches the size of the contactless coupler component 106A and/or 108A, or is greater or less than the size of the contactless coupler component 106A and/or 108A by a threshold amount). In at least some examples, the etched cavity 402 has the shape of a trapezoid cavity (as in FIG. 4A) due to the etching process. In such case, the width 404 corresponds to the length of the shorter parallel edge of the trapezoid shape (the edge closest to device components above line 204A). Meanwhile, the longer parallel edge of the trapezoid shape represented in FIG. 4A is a function of angles 408 and 410, and the depth 406. In at least some examples, the angles 408 and 410 vary depending on the etching process used to create the etched cavity 402.

In different examples, the size and/or shape of the etched cavity 402 varies. Also, in different examples, the position of the contactless coupler components 106A and 108A varies as described herein (e.g., one is part of the first die 102A and the other is part of the second die 112A, both are part of the first die 102A, both are part of the second die 112A, one or both are part of an RDL and/or other structures separate from the first or second dies 102A and 112B). In at least some examples, use of a substrate 202A with an etched cavity 402 as in layout 400A reduces coupling losses by reducing the amount of conductive material in the path of magnetic fields generated during contactless coupling operations, which in turn reduces the induced eddy currents and hence the losses.

Figure 4B:
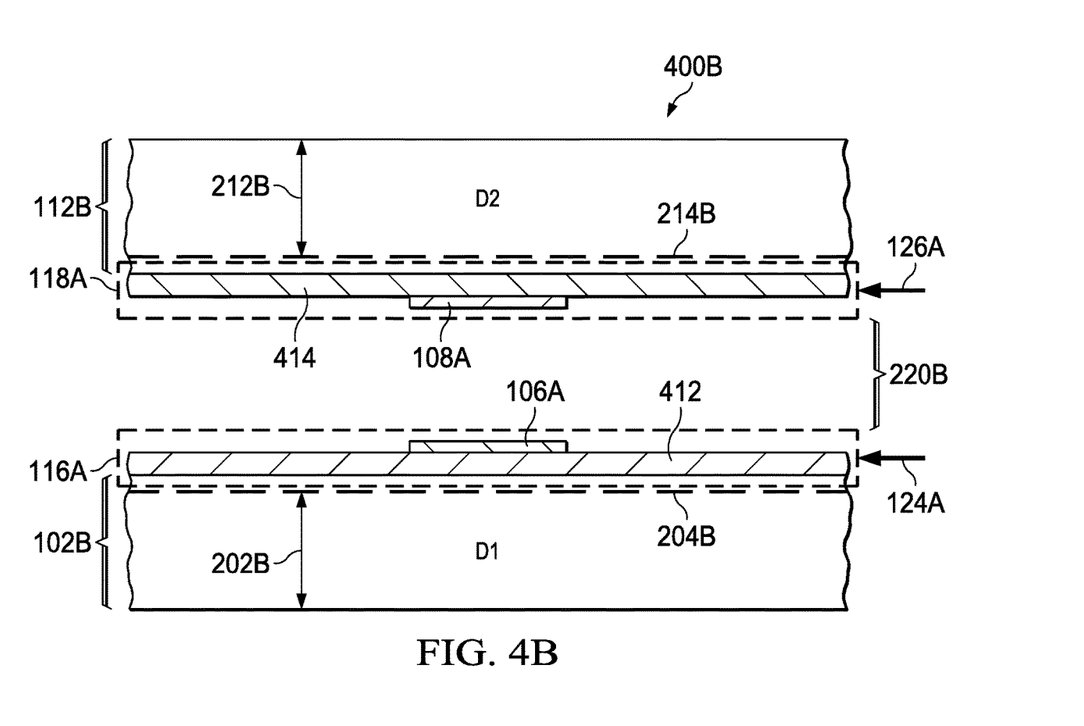

In FIG. 4B, a multi-die module layout 400B with coupling loss reduction structures 124A and 126A is represented. As shown, the first die 102B includes a substrate 202B that extends to line 204B. Above line 204B of the first die 102B reside device components associated with the first device 104 (see FIG. 1). Meanwhile, the second die 112B is flipped relative to the first die 102B and includes a substrate 212B that extends to line 214B. Below line 214B of the second die 112B reside device components associated with the second device 114 (see FIG. 1).

With the layout 400B, device components above line 204B on the first die 102B face device components below line 214B on the second device 112B with fillable space 220B between the first die 1026 and the second die 1126. In different examples, the position of the fillable space 220B relative to the contactless coupler components 106A and 108A varies. In some examples, fillable space 220B is between the contactless coupler components 106A and 108A as shown. In other examples, fillable space 220B is between the contactless coupler component 106A and the first die 1026. In other examples, fillable space 220B is between the contactless coupler component 108A and the second die 112B. Regardless of its position, the fillable space 220B is fillable with a soft non-conductive filler material and/or a rigid non-conductive filler material. As appropriate, the fillable space 220B between contactless coupler components 106A and 108A, and respective devices on the first die 1026 or the second die 1126 includes conductive paths (to connect the contactless coupler components 106A and 108A with respective devices). In some examples, the contactless coupler components 106A and 108A are part of the first die 1026 and/or the flipped second die 112B. In another example, the contactless coupler components 106A and/or 108A are part of an RDL and/or other structures that are fabricated separately from the first die 1026 and the second die 112B, and are later coupled to the first die 1026 and/or the second die 112B as appropriate.

In the layout 400B, the coupling loss reduction structure 124A corresponds to a magnetic material 412 included with an optional portion 116A of the first die 102B. More specifically, the magnetic material 412 is between the contactless coupler component 106A and the substrate 202B of the first die 102B. Similarly, the coupling loss reduction structure 126A corresponds to a magnetic material 414 included with an optional portion 118A of the second die 112B. More specifically, the magnetic material 414 is between the contactless coupler component 108A and the substrate 212B of the second die 112B. In some examples, the magnetic materials 412 and 414 are made from a combination of Cobalt (Co), Zirconium (Zr), and Tantalum (Ta). In other examples, the magnetic materials 412 and 414 are made from a combination of Nickel (Ni), Zinc (Zn), and Co ferrites. In other examples, the magnetic materials 412 and 414 are made from a combination of Iron (Fe), Co, Silicon (Si), and Boron (B). Other magnetic materials are available as well, including artificial magnetic surfaces. In some examples, the selection of a magnetic material for the magnetic materials 412 and 414 is based on a signaling frequency between devices of the first and second dies 102B and 112B (see FIG. 1) due to some magnetic materials being frequency sensitive. In at least some examples, use of the magnetic materials 412 and/or 414 reduces coupling losses by giving magnetic fields generated during contactless coupling operations a flow path that avoids the substrates 202B and/or 212B (reducing the amount of conductive material in the path of magnetic fields generated during contactless coupling operations).

Figure 4C:
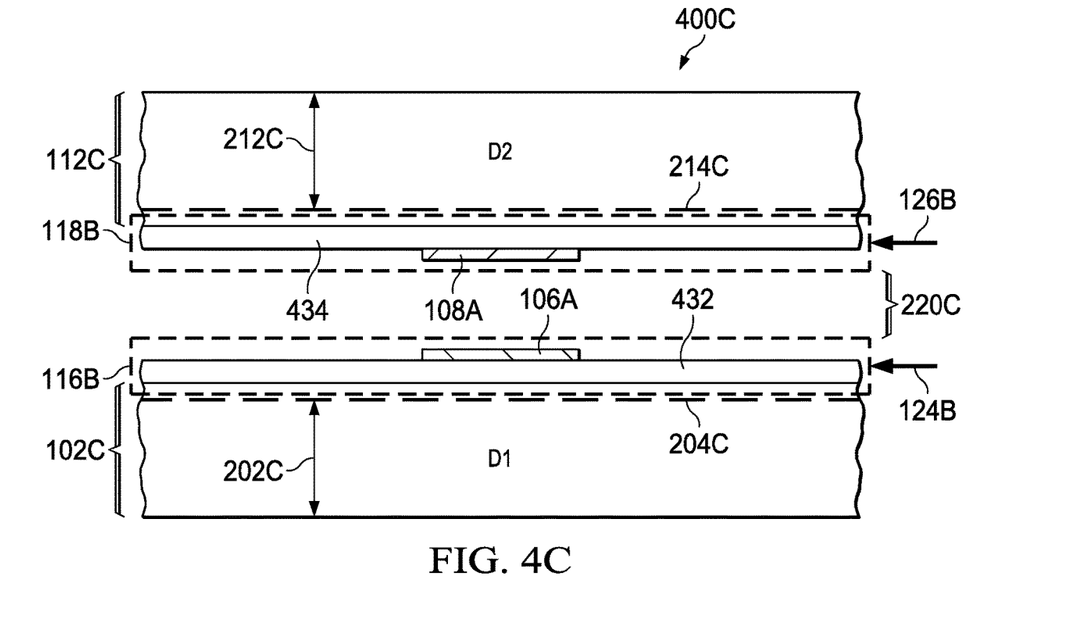

In FIG. 4C, a multi-die module layout 400C with coupling loss reduction structures 124B and 126B is represented. As shown, the first die 102C includes a substrate 202C that extends to line 204C. Above line 204C of the first die 102C reside device components associated with the first device 104 (see FIG. 1). Meanwhile, the second die 112C is flipped relative to the first die 102C and includes a substrate 212C that extends to line 214C. Below line 214C of the second die 112C reside device components associated with the second device 114 (see FIG. 1).

With the layout 400C, device components above line 204C on the first die 102C face device components below line 214C on the second device 112C with fillable space 220C between the first die 102C and the second die 112C. In different examples, the position of the fillable space 220C relative to the contactless coupler components 106A and 108A varies. In some examples, fillable space 220C is between the contactless coupler components 106A and 108A as shown. In other examples, fillable space 220C is between the contactless coupler component 106A and the first die 102C. In other examples, fillable space 220C is between the contactless coupler component 108A and the second die 112C. Regardless of its position, the fillable space 220C is fillable with a soft non-conductive filler material and/or a rigid non-conductive filler material. As appropriate, the fillable space 220C between contactless coupler components 106A and 108A, and respective devices on the first die 102C or the second die 112C includes conductive paths (to connect the contactless coupler components 106A and 108A with respective devices). In some examples, the contactless coupler components 106A and 108A are part of the first die 102C and/or the flipped second die 112C. In another example, the contactless coupler components 106A and/or 108A are part of an RDL and/or other structures that are fabricated separately from the first die 102C and the second die 112C, and are later coupled to the first die 102C and/or the second die 112C as appropriate.

In the layout 400C, the coupling loss reduction structure 124b corresponds to an RDL 432 included with an optional portion 116B of the first die 102C. More specifically, the contactless coupler component 106A is formed on a side of the RDL 432 facing the second die 112C. In other examples, the contactless coupler component 106A is formed on a side of the RDL 432 facing the substrate 202C. Similarly, the coupling loss reduction structure 126B corresponds to an RDL 434 included with an optional portion 118B of the second die 112C. More specifically, the contactless coupler component 108A is formed on a side of the RDL 434 facing the first die 102C. In other examples, the contactless coupler component 108A is formed on a side of the RDL 434 facing the substrate 212C. Forming one or both of the contactless coupler components 106A and 108A on an RDL (e.g., RDLs 432 or 434) as described herein enables the metal thickness of the contactless coupler components 106A and 108A to be thicker compared to forming the contactless coupler components 106A and 108A using other structures of the first die 102C or second die 112C. Use of thicker metal to form the contactless coupler components 106A and 108A reduces resistivity-related coupling losses during contactless coupling operations.

Figure 4D:
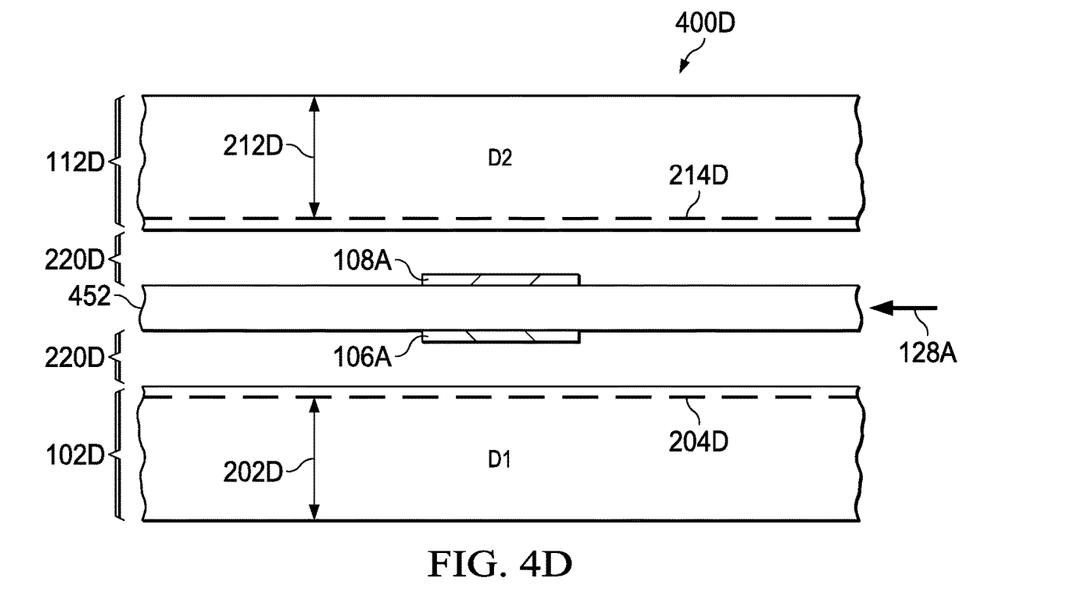

In FIG. 4D, a multi-die module layout 400D with coupling loss reduction structure 128A is represented. As shown, the first die 102D includes a substrate 202D that extends to line 204D. Above line 204D of the first die 102D reside device components associated with the first device 104 (see FIG. 1). Meanwhile, the second die 112D is flipped relative to the first die 102D and includes a substrate 212D that extends to line 214D. Below line 214D of the second die 122D reside device components associated with the second device 114 (see FIG. 1).

With the layout 400D, device components above line 204D on the first die 102D face device components below line 214D on the second device 112D with fillable space 220D between the first die 102D and the second die 112D. In different examples, the position of the fillable space 220D relative to the contactless coupler components 106A and 108A varies. In some examples, fillable space 220D is between the contactless coupler component 106A and the first die 102D, and between the contactless coupler component 108A and the second die 112D as shown. Regardless of its position, the fillable space 220D is fillable with a soft non-conductive filler material and/or a rigid non-conductive filler material. As appropriate, the fillable space 220D between contactless coupler components 106A and 108A, and respective devices on the first die 102D or the second die 112D includes conductive paths (to connect the contactless coupler components 106A and 108A with respective devices). In some examples, the contactless coupler components 106A and 108A are part of the first die 102D and/or the flipped second die 112D. In another example, the contactless coupler components 106A and/or 108A are part of an RDL and/or other structures that are fabricated separately from the first die 102D and the second die 112D, and are later coupled to the first die 102D and/or the second die 112D as appropriate.

In some examples, the coupling loss reduction structure 128A of layout 400D corresponds to a material 452 positioned between the contactless coupler components 106A and 108A to reduce coupling losses. In one example, the material 452 includes an RDL with one or more of the contactless coupler components 106A and 108A formed on the RDL. In another example, the material 452 corresponds to a magnetic core between the contactless coupler components 106A and 108A, where the position of the magnetic core is limited to an active area between the contactless coupler components 106A and 108A.

Figure 5A:
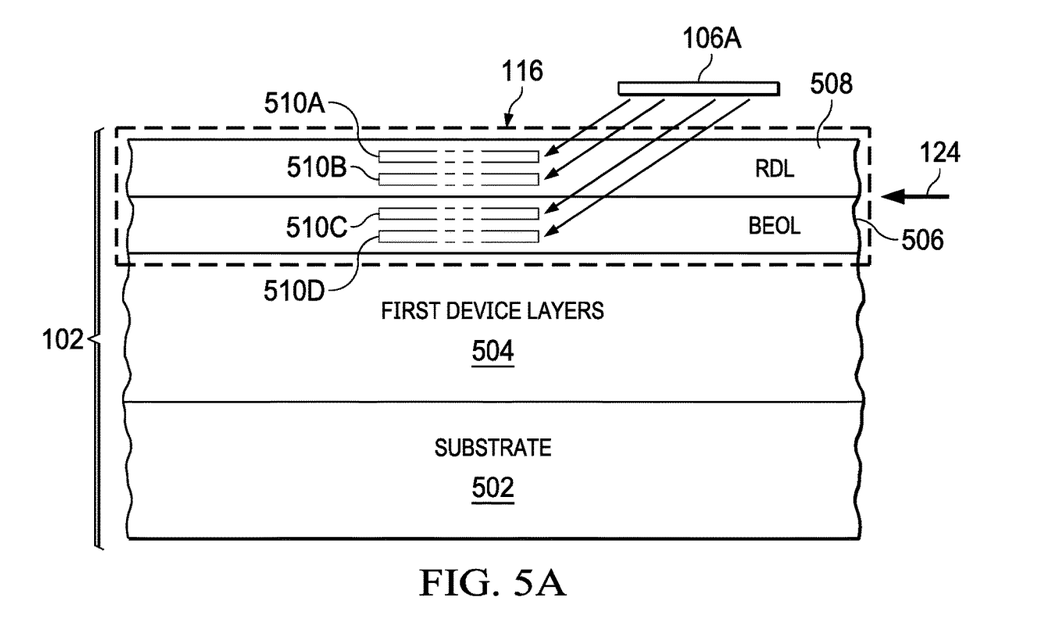
FIGS. 5A-5B show different die arrangements in accordance with various examples.
Figure 5B:
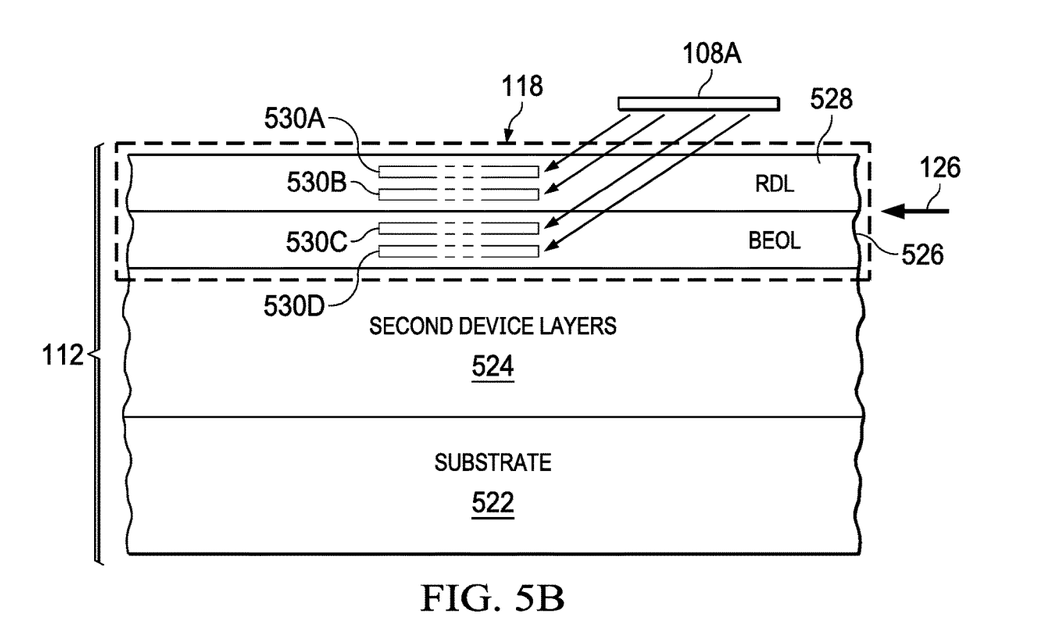

FIGS. 5A-5B show different die arrangements in accordance with various examples. In FIG. 5A, various portions for the first die 102 are represented, including a substrate 502, first device layers 504 (to form components of the first device 104), backend stack layers (sometimes referred to as "BEOL" in industry) 506, and RDL 508. The backend stack layers 506 correspond to metal interconnections and insulative layers above the first device layers 504, and are used to connect components formed by the first device layers 504 together. As desired, additional components (e.g., contactless coupler components and/or coupling loss reduction structures) are added to the backend stack layers 506. Meanwhile, the RDL 508 corresponds to metal interconnections and insulative layers to reposition connection points (conductive paths) for components formed by the first device layers 504. As desired, additional components (e.g., contactless coupler components and/or coupling loss reduction layers) are added to the RDL 508. The RDL 508 connects to the first device layers 504 directly or through the backend stack layers 506, and facilitates packaging options.

In FIG. 5A, backend stack layers 506 and RDL 508 are part of the optional portion 116 of the first die 102. In some examples, the contactless coupler component 106A resides in an upper portion 510A of the RDL 508. In other examples, the contactless coupler component 106A resides in a lower portion 510B of the RDL 508. In other examples, the contactless coupler component 106A resides in an upper portion 510C of the backend stack layers 506. In other examples, the contactless coupler component 106A resides in a lower portion 510D of the backend stack layers 506.

To reduce contactless coupling losses as described herein, a second coupling loss reduction structure 124 is added to first die 102. In at least some examples, the second coupling loss reduction structure 124 is part of the optional portion 116 of the first die 102. In one example, the second coupling loss reduction structure 124 is a magnetic material between the contactless coupler component 106A and the substrate 502. In one example, the second coupling loss reduction structure 124 is a magnetic material between the contactless coupler component 106A and another contactless coupler component (e.g., a magnetic core between the contactless coupler component 106A and the contactless coupler component 108A). In another example, the second coupling loss reduction structure 124 is an RDL between the contactless coupler component 106A and the substrate 502. In another example, the second coupling loss reduction structure 124 is an RDL between the contactless coupler component 106A and another contactless coupler component (e.g., contactless coupler component 108A).

In FIG. 5B, various portions of the second die 112 are represented, including a substrate 522, second device layers 524 (corresponding to the second device 114), backend stack layers 526, and RDL 528. The backend stack layers 526 correspond to metal interconnections and insulative layers above the second device layers 524, and are used to connect components formed by the second device layers 524 together. As desired, additional components (e.g., contactless coupler components and/or coupling loss reduction layers) are added to the backend stack layers 526. Meanwhile, the RDL 528 corresponds to metal interconnections and insulative layers to reposition connection points (conductive paths) for components formed by the second device layers 524. As desired, additional components (e.g., contactless coupler components and/or coupling loss reduction layers) are added to the RDL 528. The RDL 528 connects to the second device layers 524 directly or through the backend stack layers 526, and facilitates packaging options.

In FIG. 5B, backend stack layers 526 and RDL 528 are part of the optional portion 118 of the second die 112. In some examples, the contactless coupler component 108A resides in an upper portion 530A of the RDL 528. In other examples, the contactless coupler component 108A resides in a lower portion 530B of the RDL 528. In other examples, the contactless coupler component 108A resides in an upper portion 530C of the backend stack layers 526. In other examples, the contactless coupler component 108A resides in a lower portion 530D of the backend stack layers 526.

To reduce contactless coupling losses as described herein, a third coupling loss reduction structure 126 is added to second die 112. In at least some examples, the third coupling loss reduction structure 126 is part of the optional portion 118 of the second die 112. In one example, the third coupling loss reduction structure 126 is a magnetic material between the contactless coupler component 108A and the substrate 522. In one example, the third coupling loss reduction structure 126 is a magnetic material between the contactless coupler component 108A and another contactless coupler components (e.g., a magnetic core between the contactless coupler component 108A and the contactless coupler component 106A). In another example, the third coupling loss reduction structure 126 is an RDL between the contactless coupler component 108A and the substrate 522. In another example, the second coupling loss reduction structure 124 is an RDL between the contactless coupler component 106A and the contactless coupler components 108A.

In some examples, all contactless coupler components for a multi-die module (e.g., multi-die module 100) are part of the first die 102 (e.g., included in the optional portion 116) represented in FIG. 5A. In other examples, all contactless coupler components for a multi-die module (e.g., multi-die module 100) are part of the second die 112 (e.g., included in the optional portion 118) represented in FIG. 5B. In other examples, one or more contactless coupler components for a multi-die module (e.g., multi-die module 100) are fabricated separately from the first die 102 and second die 112, and are later coupled to a respective device of the first die 102 or second die 112 via conductive paths (to connect the contactless coupler components 106A and 108A with respective devices). As desired, fillable space 220 in a multi-die module 100 can be filled with a soft material (e.g., a silicone-based material) and/or a rigid material (e.g., a plastic or epoxy) as discussed for FIGS. 4A-4D.

Figure 6:
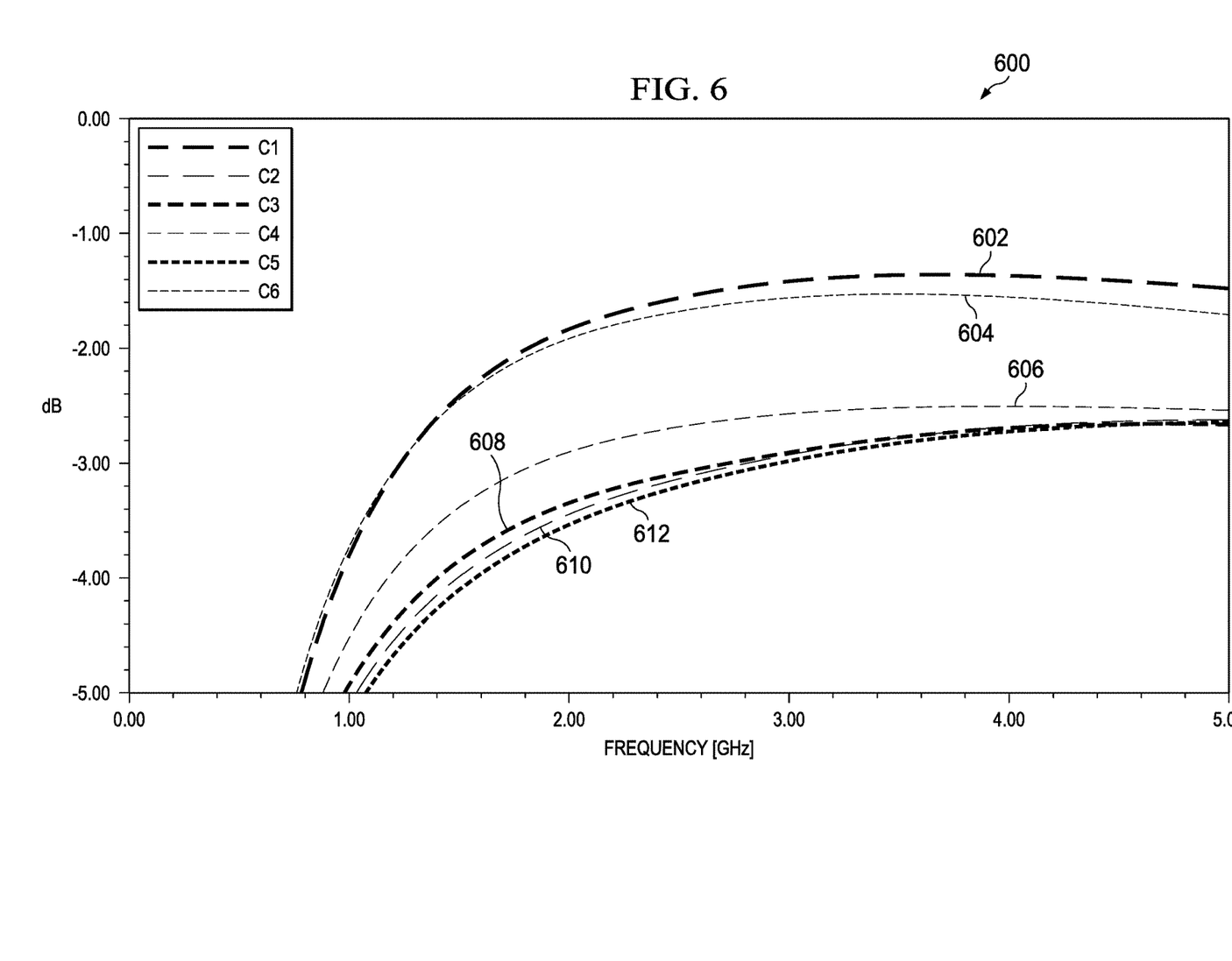
FIG. 6 shows a graph with different curves representing coupling signal strength due to different coupling loss reduction structure options in accordance with various examples.

FIG. 6 shows a graph 600 with curves 602, 604, 606, 608, 610, and 612 representing coupler signal strength due to different coupling loss reduction structure options in accordance with various examples. For graph 600, each of the curves 602, 604, 606, 608, 610, and 612 corresponds to a different substrate cavity size (C1-C6). More specifically, curve 602 corresponds to the largest substrate cavity C1 (e.g., C1 leaves a substrate thickness of 10 µm below a contactless coupler component). Curve 604 corresponds to the next largest substrate cavity C2 (e.g., C2 leaves a substrate thickness of 20 µm below a contactless coupler component). Curve 606 corresponds to the next largest substrate cavity C3 (e.g., C3 leaves a substrate thickness of 110 µm below a contactless coupler component). Curve 608 corresponds to the next largest substrate cavity C4 (e.g., C4 leaves a substrate thickness of 210 µm below the contactless coupler component). Curve 610 corresponds to the next largest substrate cavity C5 (e.g., C5 leaves a substrate thickness of 310 µm below the contactless coupler component). Curve 612 corresponds to the next largest substrate cavity C6 (e.g., C6 leaves a substrate thickness of 410 µm below the contactless coupler component).

As represented in graph 600, coupling signal strength varies as a function of frequency and substrate cavity size (the amount of substrate material below a contactless coupler component). Accordingly, in at least some examples, a multi-die module employs a coupling loss reduction structure corresponding to a cavity formed in a substrate, where the substrate cavity size below a contactless coupler component is as large as possible without compromising the structural integrity of the respective die (a minimum amount of substrate material aligned with a contactless coupler component maximizes signal strength for some signaling frequencies). In some examples, a non-conductive filler material can be added to an etched cavity to enhance the structural integrity of the respective die. In such examples, the substrate thickness is reduced compared to scenarios where no filler is used.

Figure 7:
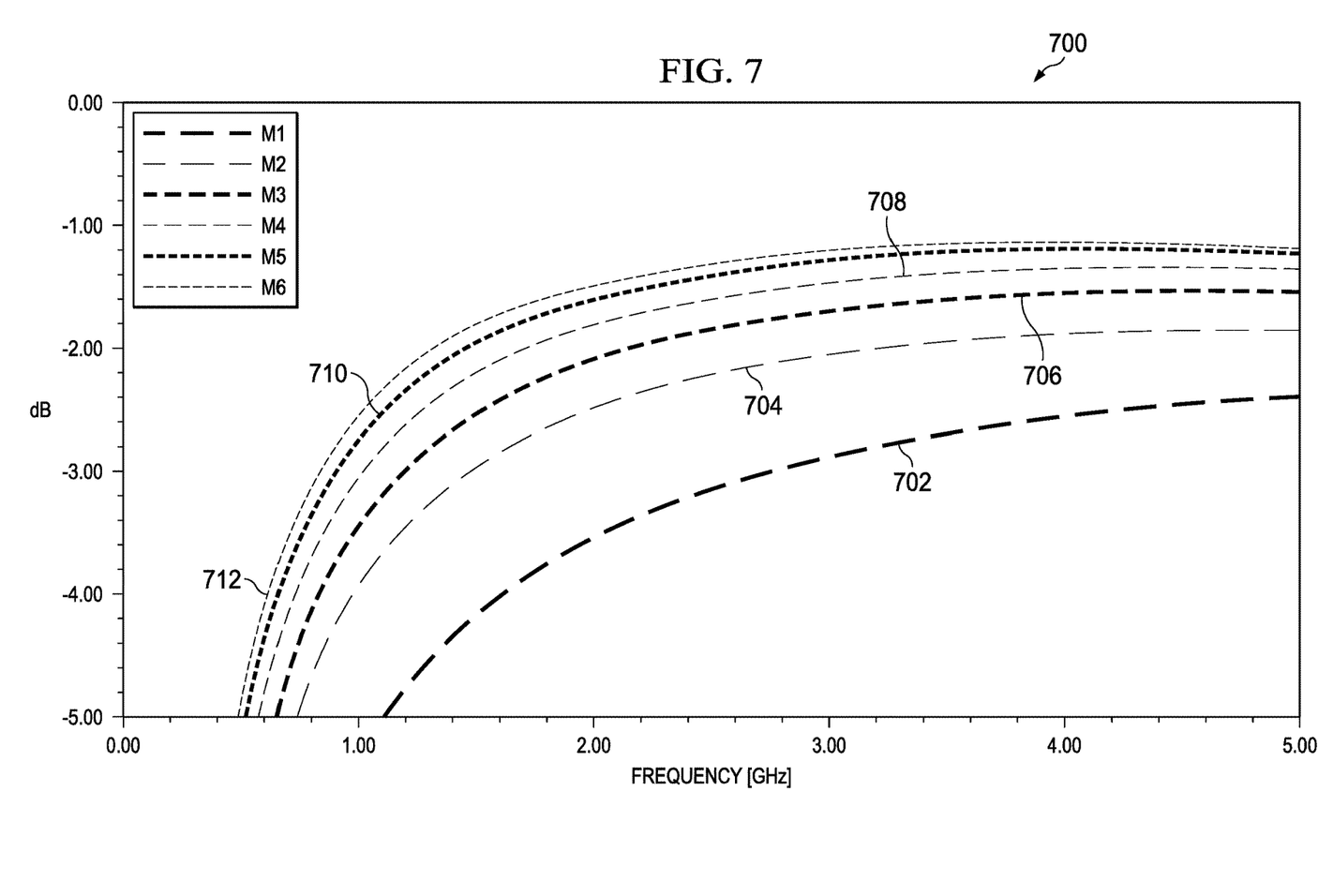
FIG. 7 shows another graph with different curves representing coupling signal strength due to different coupling loss reduction structure options in accordance with various examples.

FIG. 7 shows a graph 700 with 702, 704, 706, 708, 710, and 712 representing coupler signal strength due to different coupling loss reduction structure options in accordance with various examples. For graph 700, each of the curves 702, 704, 706, 708, 710, and 712 corresponds to a different magnetic material (M1-M6) used for a coupling loss reduction structure as described herein. More specifically, curve 702 corresponds to a magnetic material (M1) with a low relative permeability (e.g., M1 has a relative permeability of 1). Curve 704 corresponds to a magnetic material (M2) with a higher relative permeability than M1 (e.g., M2 has a relative permeability of 5). Curve 706 to a magnetic material (M3) with a higher relative permeability than M2 (e.g., M3 has a relative permeability of 9). Curve 708 to a magnetic material (M4) with a higher relative permeability than M3 (e.g., M4 has a relative permeability of 13). Curve 710 corresponds to a magnetic material (M5) with a higher relative permeability than M4 (e.g., M5 has a relative permeability of 17). Curve 712 corresponds to a magnetic material (M6) with a higher relative permeability than M5 (e.g., M6 has a relative permeability of 20).

As represented in graph 700, coupling signal strength varies as a function of frequency and the relative permeability of a magnetic material used for a coupling loss reduction structure (a higher relative permeability improves signal strength). Accordingly, in at least some examples, a multi-die module employs a coupling loss reduction structure with a magnetic material having a relative permeability appropriate for high-frequency signaling. For lower frequency coupler signaling scenarios, the relative permeability of a magnetic material used for a coupling loss reduction structure can be lower.

Figure 8:
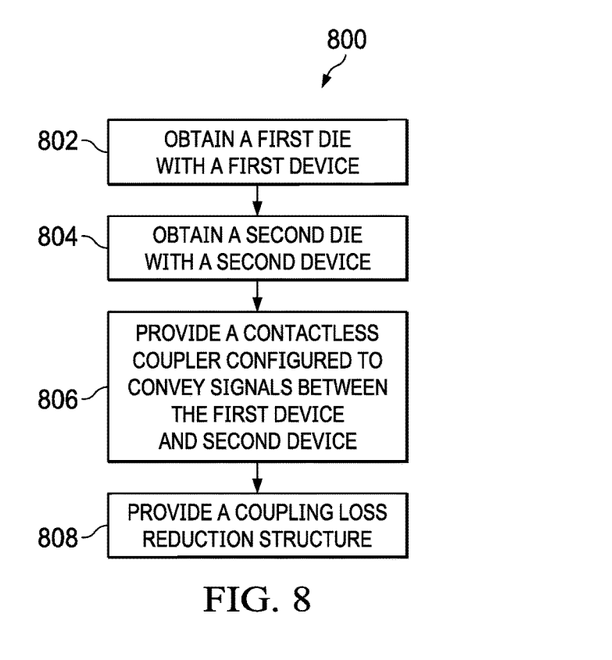
FIG. 8 shows a flowchart of a multi-die module fabrication method in accordance with various examples.

FIG. 8 shows a flowchart of a multi-die module fabrication method 800 in accordance with various examples. As shown, the method 800 comprises obtaining a first die (e.g., die 102) with a first device (e.g., the first device 104) at block 802. At block 804, a second die (e.g., die 112) with a second device (e.g., the second device 114) is obtained. At block 806, a contactless coupler (e.g., the contactless coupler 105) configured to convey signals between the first device and the second device is provided. At block 808, a coupling loss reduction structure (e.g., one or more of the coupling loss reduction structures 122, 124, 126, 168) is provided.

In some examples of method 800, providing a coupling loss reduction structure (block 808) comprises forming a cavity in a substrate of the first die, the formed cavity aligned with a position of the contactless coupler. More specifically, in some examples, the first device is on a first side of the first die, and forming the cavity comprises etching an open cavity on another side of the first die that is opposite the first side.

In some examples of method 800, providing a coupling loss reduction structure (block 808) comprises fabricating the first die or the second die with a magnetic material between the contactless coupler and a substrate. In some examples, the magnetic material is formed within backend stack layers of the first or second die. In other examples, the magnetic material is formed above backend stack layers of the first or second die. In some examples of method 800, providing a coupling loss reduction structure (block 808) comprises fabricating the first die or second die with an RDL that forms at least part of the contactless coupler. In some examples of method 800, providing a coupling loss reduction structure (block 808) comprises providing a magnetic core for the contactless coupler.

In this description, the term "couple" or "couples" means either an indirect or direct wired or wireless connection. Thus, if a first device couples to a second device, that connection may be through a direct connection or through an indirect connection via other devices and connections. Also, in this description, the recitation "based on" means "based at least in part on." Therefore, if X is based on Y, then X may be a function of Y and any number of other factors.

Modifications are possible in the described embodiments, and other embodiments are possible, within the scope of the claims. For example, while various figures show a multi-die module layout with a face-to-face arrangement (devices of one die face devices of another die), other multi-die module layouts are possible (e.g., face-to-back, back-to-back, side-to-side).

What is claimed is:

1. A multi-die module, comprising:
   a first die including a first device;
   a second die including a second device;
   a contactless coupler configured to convey signals between the first device and the second device; and
   a coupling loss reduction structure having a cavity formed in the first die or the second die, the cavity aligned with the contactless coupler.

2. The multi-die module of claim 1, wherein the first device comprises an oscillator core, and the second device comprises a resonator.

3. The multi-die module of claim 1, wherein the contactless coupler is a capacitive coupler.

4. The multi-die module of claim 1, wherein the contactless coupler is an inductive coupler.

5. The multi-die module of claim 1, wherein the first device is on a first side of the first die, and wherein the formed cavity is an etched cavity on a second side of the first die that is opposite the first side.

6. The multi-die module of claim 1, wherein the coupling loss reduction structure comprises a magnetic material core for the contactless coupler.

7. The multi-die module of claim 1, wherein the first die and the second die are arranged such that the first device and the second device face each other.

8. The multi-die module of claim 1, wherein the coupling loss reduction structure comprises a magnetic material between the contactless coupler and a substrate of the first die or second die.

9. The multi-die module of claim 8, wherein the magnetic material comprises an artificial magnetic surface.

10. The multi-die module of claim 1, wherein the coupling loss reduction structure comprises a redistribution layer (RDL) on the first die or second die, wherein the RDL forms at least part of the contactless coupler.

11. A multi-die module, comprising:
    a first die including a first device;

a second die including a second device;
and inductive coupler configured to convey signals between the first device and the second device, wherein the inductive coupler includes a first coil coupled to the first device and a second coil coupled to the second device, the first coil having more windings than the second coil; and
a coupling loss reduction structure.

* * * * *